(12) United States Patent
Bih et al.

(10) Patent No.: US 11,081,341 B2
(45) Date of Patent: Aug. 3, 2021

(54) APPARATUS FOR FABRICATING A SEMICONDUCTOR DEVICE WITH TARGET SPUTTERING AND TARGET SPUTTERING METHOD FOR FABRICATING THE SEMICONDUCTOR DEVICE

(71) Applicant: TAIWAN SEMICONDUCTOR MANUFACTURING COMPANY LTD., Hsinchu (TW)

(72) Inventors: Shih Wei Bih, Taichung (TW); Yen-Yu Chen, Taichung (TW); Yi-Ming Dai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 141 days.

(21) Appl. No.: 16/299,987

(22) Filed: Mar. 12, 2019

(65) Prior Publication Data
US 2020/0035487 A1 Jan. 30, 2020

Related U.S. Application Data

(60) Provisional application No. 62/711,787, filed on Jul. 30, 2018.

(51) Int. Cl.
*H01L 21/02* (2006.01)
*C23C 14/34* (2006.01)
*C23C 14/35* (2006.01)
*C23C 14/54* (2006.01)

(52) U.S. Cl.
CPC .... *H01L 21/02266* (2013.01); *C23C 14/3407* (2013.01); *C23C 14/35* (2013.01); *C23C 14/54* (2013.01); *H01L 21/02186* (2013.01)

(58) Field of Classification Search
CPC combination set(s) only.
See application file for complete search history.

(56) References Cited

U.S. PATENT DOCUMENTS

| | | | |
|---|---|---|---|
| 2011/0133651 A1* | 6/2011 | Chistyakov | H01J 37/3444 315/111.41 |
| 2016/0233056 A1* | 8/2016 | Hartig | H01J 37/3405 |
| 2018/0174808 A1* | 6/2018 | Suetsugu | H01J 37/3402 |
| 2019/0169738 A1* | 6/2019 | Okuma | C23C 14/0652 |

* cited by examiner

*Primary Examiner* — Mounir S Amer
(74) *Attorney, Agent, or Firm* — WPAT, P.C., Intellectual Property Attorneys; Anthony King

(57) ABSTRACT

The present disclosure provides an apparatus for fabricating a semiconductor device with target sputtering, including a chamber for accommodating a consumable target, a target accumulative consumption counter, wherein the target accumulative consumption counter provides a signal correlated to an amount of the consumable target being consumed, and a power supply communicates with the consumable target counter, wherein the power supply provides a power output according to the signal.

20 Claims, 14 Drawing Sheets

APPARATUS FOR FABRICATING A SEMICONDUCTOR DEVICE WITH TARGET SPUTTERING AND TARGET SPUTTERING METHOD FOR FABRICATING THE SEMICONDUCTOR DEVICE

CROSS REFERENCE TO RELATED APPLICATIONS

This application claims the benefit of prior-filed provisional application No. 62/711,787, filed Jul. 30, 2018.

BACKGROUND

Sputtering, such as physical vapor deposition (PVD), is a fabrication operation of depositing a layer of metal, insulation material or other suitable material on an object. Sputtering operation can be applied on substrates, semiconductor integrated circuits, and also can be used for depositing coatings of materials onto other types of panels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
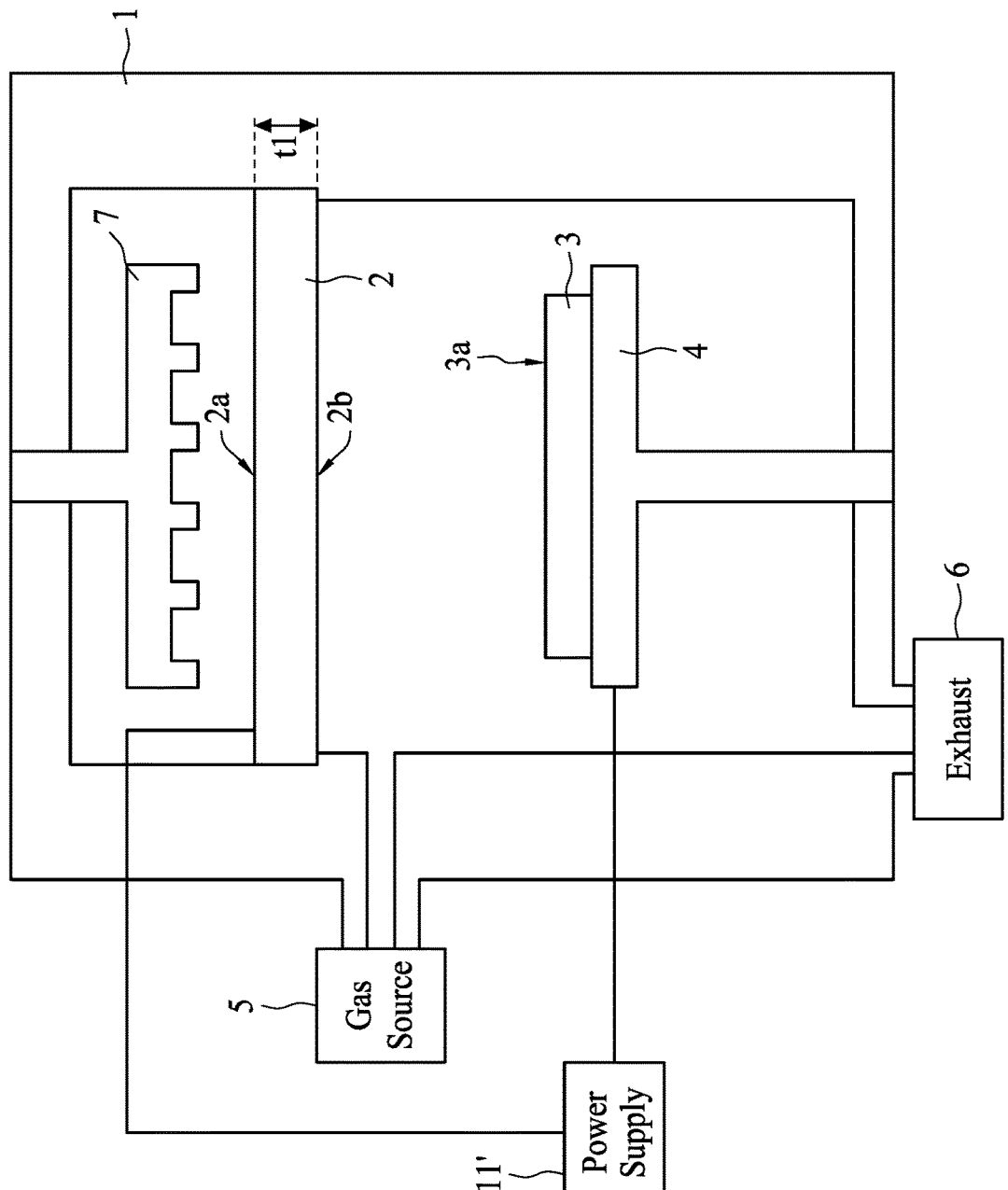
FIG. 1A is a schematic drawing illustrating a sputtering apparatus.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In a sputtering operation, a substrate placed in a chamber can be connected to a terminal of a power supply, for example an anode of the power supply; while a target placed in the chamber is electrically connected to another terminal of the power supply, for example a cathode of the power supply. The chamber may be filled with gas, such as inert gas at low pressure and/or reaction gas. When a voltage difference between the two aforesaid terminals reaches at least above a certain value, a glow discharge is established inside the chamber. Thereby ionized gas atoms may be accelerated across an established electric field and impact the target with sufficient energy, causing molecules of a material of the target to be sputtered from the target. The sputtered molecules may thus be transported and deposited on a surface of a substrate, further forming a layer above the surface of the substrate.

Each target utilized in sputtering operation has a target life, which can be estimated by a target accumulative consumption (also known as accumulated energy consumption) of the target commonly measured in kilowatt-hours (kWh). A target accumulative consumption can be referred to as a total amount of consumption since the start of the target life of the target. For example, a target life of a given target is estimated to be 600 kWh for the sputter operation tool, thus when the target accumulated consumption of the sputter operation tool reaches 600 kWh, the target is being consumed and thereby reaches its end of the target life.

Referring to FIG. 1A, FIG. 1A is a schematic drawing illustrating a sputtering apparatus. A sputtering apparatus 100 may include a chamber 1, a supporter 4, a magnetic structure 7, and a power supply 11'. The sputtering apparatus 100 is connected to a gas source 5 and an exhaust 6 to control the gas pressure of an operation gas filled in the chamber 1, such as an inert gas at low pressure and/or reaction gas. A consumable target 2 is accommodated inside the chamber 1, wherein a top surface 2a of the consumable target 2 faces the magnetic structure 7. A material of the consumable target 2 may include metal, insulating material, or the like. A substrate 3 is secured by the supporter 4, which is accommodated inside the chamber 1, as a top surface 3a of the substrate 3 faces a bottom surface 2b of the consumable target 2. Thence a sputtering operation can be performed to deposit the material of the consumable target 2 over the top surface 3a of the substrate 3, as the consumable target 2 may be consumed during the sputtering operation.

The magnetic structure 7 may include permanent magnet, rotatable magnet, or the like in various shapes and forms. The magnetic structure 7 may form magnetic field and form a high density plasma region, further improve the sputter rate and/or the uniformity of sputtering.

Figure 1B:
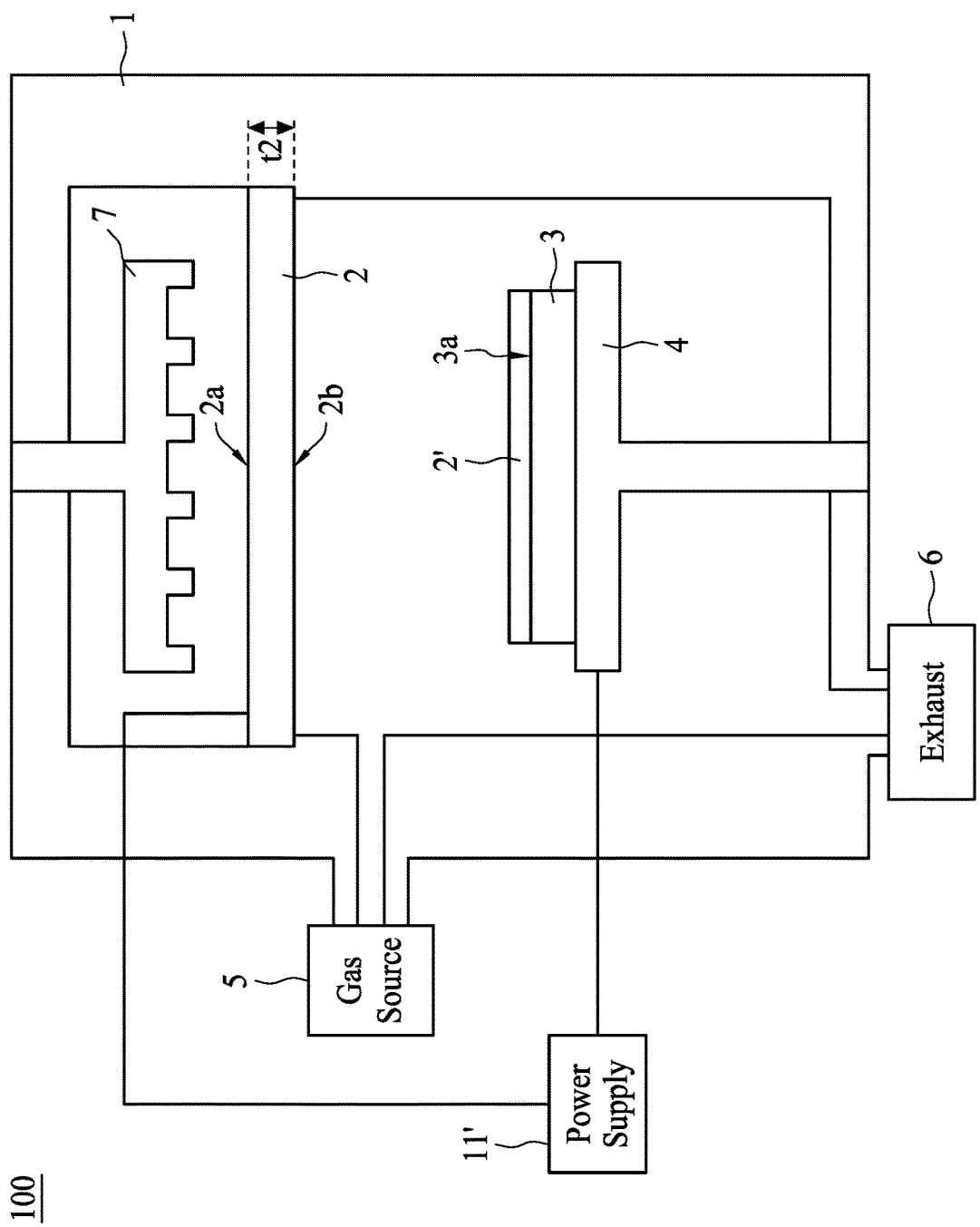
FIG. 1B is a schematic drawing illustrating a sputtering apparatus.
Figure 2A:
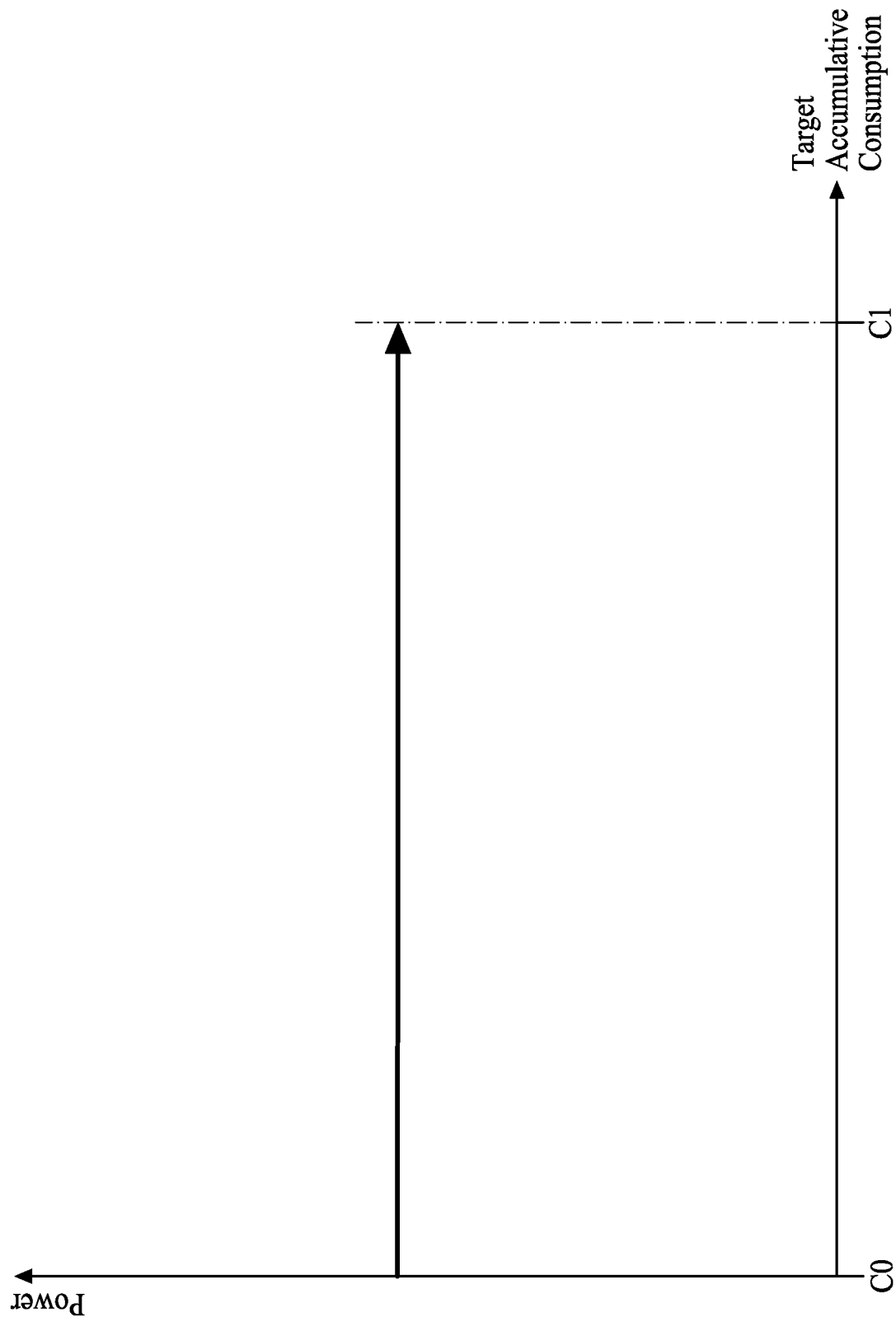
FIG. 2A is a diagram showing a relationship between a magnitude of a power output of a sputtering apparatus and a target accumulative consumption of a consumable target.

Referring to FIG. 1B and FIG. 2A, FIG. 1B is a schematic drawing illustrating the sputtering apparatus 100 subsequent to a portion of the consumable target 2 being consumed, and FIG. 2A is a diagram showing a relationship between a magnitude of a power output from the power supply 11' and a target accumulative consumption of the consumable target 2. A deposited layer 2' including a material of the consumable target 2 is formed above the top surface 3a of the substrate 3. Herein the start of the consumption (also referred to as the start of a target life) is denoted as C0, which is the beginning of the consumption of the consumable target 2; while the end of the consumption is denoted as C1, which can be the end of the target life or the end of the sputtering operation as a predetermined target accumulative consumption being consumed. Conventionally, the power supply 11' supplies the power output to the consumable target 2, wherein the sputtering operation is performed under the power output having a substantially fixed magnitude during the start of the target life C0 and the end of the consumption C1. However, during the operation of sputtering the consumable target 2 is consumed, thence a thickness t1 of the consumable target 2 decreases to a thickness t2 less than t1 as the molecules of the material of the consumable target 2 being sputtered and departs from the consumable target 2. Due to the reduction of the thickness, the resistivity of the consumable target 2 decreases accordingly since the resistivity is proportionally related to the thickness of the consumable target 2. As can be derived from the Ohm's law, under the circumstance of the magnitude of the power output being fixed, when the resistivity of the consumable target 2 decreases, the current flows through the consumable target 2 increases as an electric potential difference between the top surface 2a and a bottom surface 2b decreases. A relationship between a target accumulative consumption of the consumable target 2 and the electric potential difference between the top surface 2a and the bottom surface 2b of a consumable target 2 is subsequently discussed in FIG. 2B.

Figure 2B:
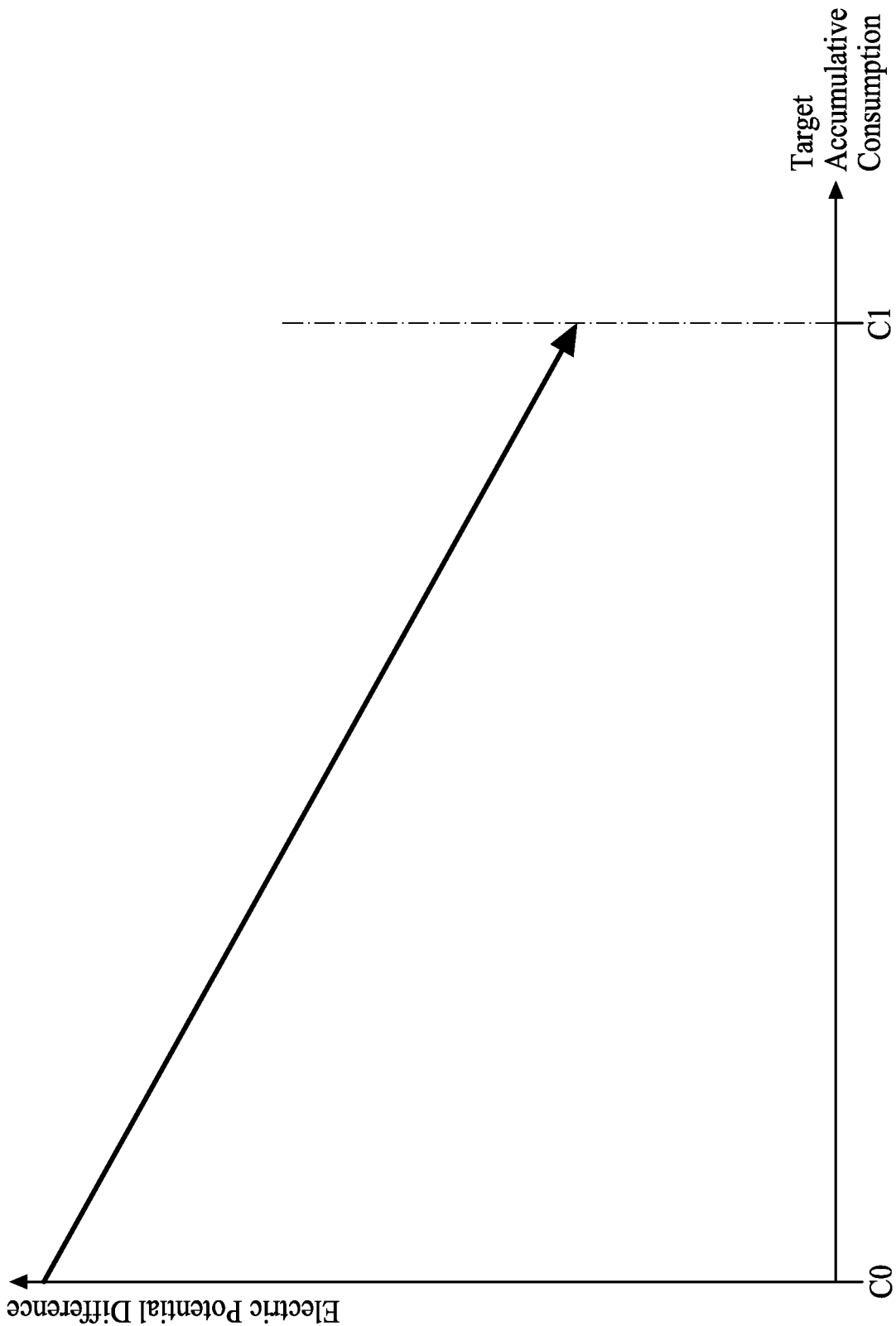
FIG. 2B is a diagram showing a relationship between a target accumulative consumption of a consumable target and an electric potential difference between a top surface and a bottom surface of a consumable target.

Referring to FIG. 1A, FIG. 1B and FIG. 2B, FIG. 2B is a diagram showing a relationship between a target accumulative consumption of the consumable target 2 and an electric potential difference between the top surface 2a and the bottom surface 2b of the consumable target 2. As previously discussed in FIG. 1B, the electric potential difference between the top surface 2a and the bottom surface 2b decreases during the start of the target life C0 and the end of the consumption C1. However, a deposition rate of depositing the material of the deposited layer 2' over the top surface 3a of the substrate 3 is proportionally related to the aforesaid electric potential difference and thereby may be decreased due to the reduction of the electric potential difference. Thus the material of the deposited layer 2' over the substrate 3 may not be uniform with regard to the composition, the concentration or other related factors that can indicate a property of the deposited layer 2'.

Figure 2C:
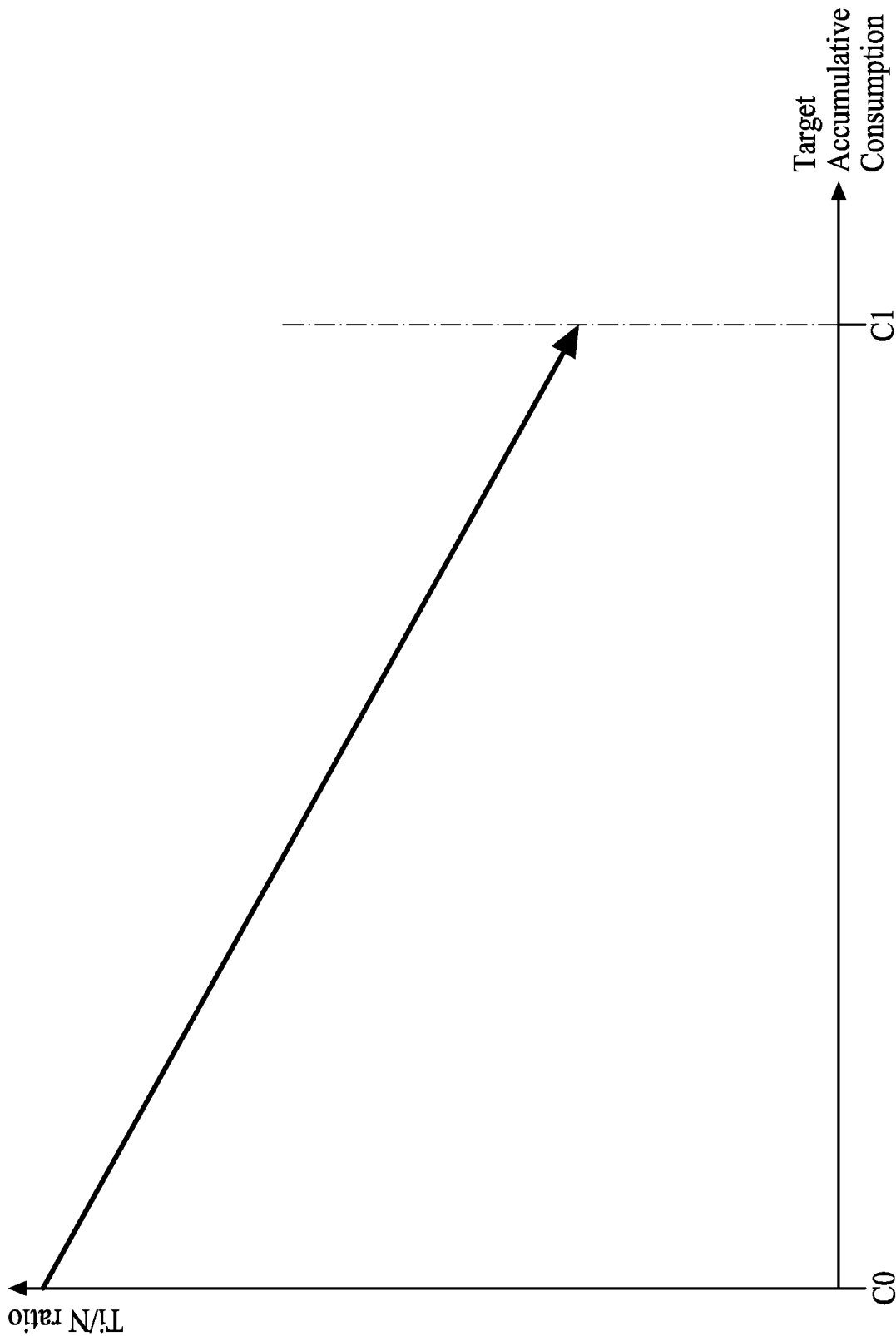
FIG. 2C is a diagram showing a relationship between a target accumulative consumption of a consumable target and a titanium-to-nitride concentration ratio of a deposited titanium nitride layer.

Referring to FIG. 1A, FIG. 1B and FIG. 2C, FIG. 2C is a diagram showing a relationship between a target accumulative consumption of the consumable target 2 and a titanium-to-nitride concentration ratio of a deposited titanium nitride layer 2'. For exemplary demonstration, the consumable target 2 includes titanium (Ti) and the gas source 5 supplies nitrogen ($N_2$) into the chamber 1, as a layer of titanium nitride (TiN) may be deposited over the top surface 3a of the substrate 3. Due to the decreasing tendency of titanium deposition rate during the start of the target life C0 and the end of the consumption C1, a concentration of titanium as well as a ratio of titanium-to-nitride concentration ratio of an as-deposited titanium nitride layer may decline, further deteriorating the performance of fabricated semiconductor devices, such as the processing efficiency of the devices may be lowered.

Present disclosure provides an apparatus for fabricating a semiconductor device with target sputtering and methods for fabricating a semiconductor device with target sputtering which may ameliorate the issue of the decreasing tendency of deposition rate as well as a given non-uniform property of the deposited layer 2'.

Figure 3:
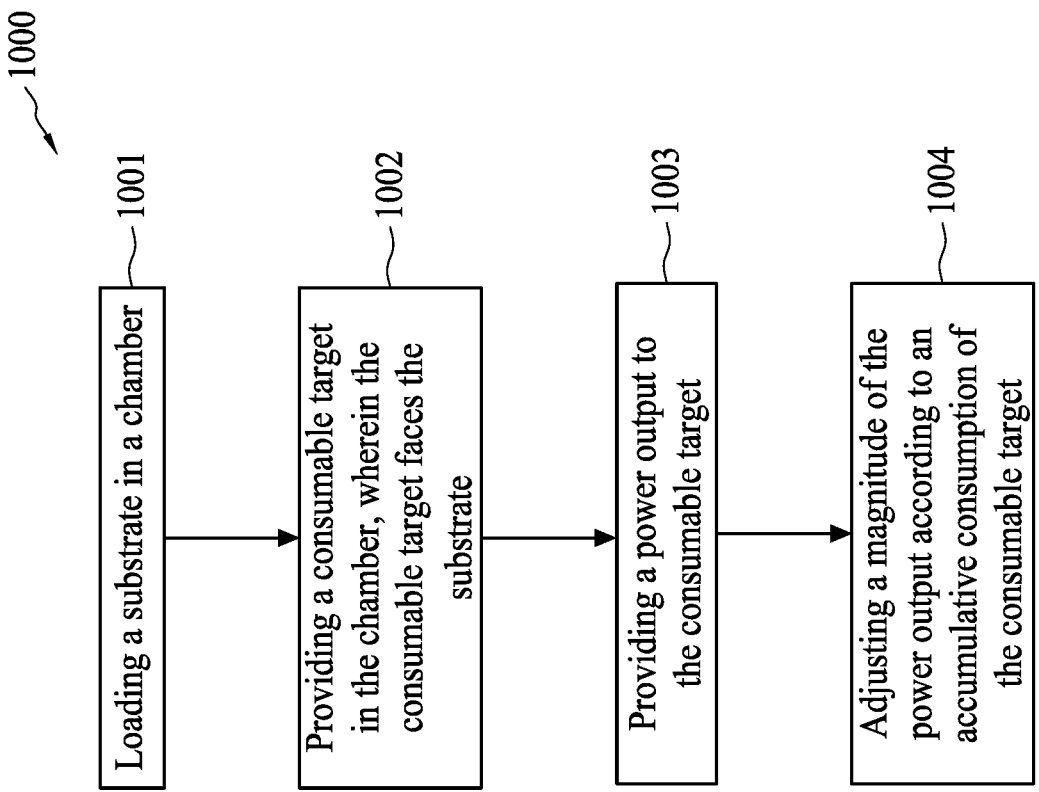
FIG. 3 shows a flow chart representing method for fabricating a semiconductor device with target sputtering, in accordance with some embodiments of the present disclosure.

Referring to FIG. 3, FIG. 3 shows a flow chart 1000 representing method for fabricating a semiconductor device with target sputtering, in accordance with some embodiments of the present disclosure. The method for fabricating a semiconductor device with target sputtering includes loading a substrate in a chamber (operation 1001), providing a consumable target in the chamber, wherein the consumable target faces the substrate (operation 102), providing a power output to the consumable target (operation 1003), and adjusting a magnitude of the power output according to an accumulative consumption of the consumable target (operation 1004).

Figure 4A:
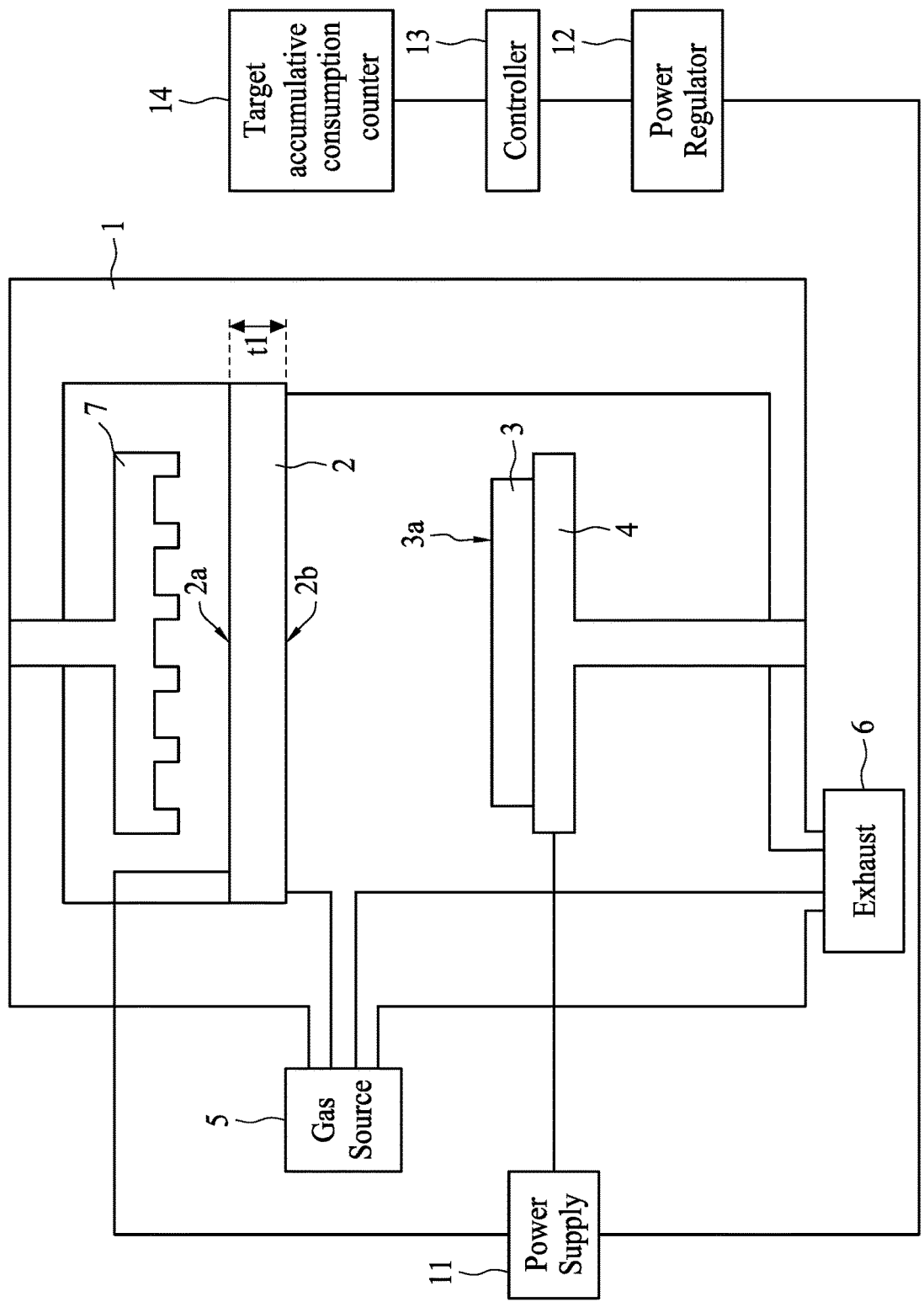
FIG. 4A and FIG. 4B are schematic drawings illustrating a sputtering apparatus during intermediate stages of target sputtering operation, in accordance with some embodiments of the present disclosure.
Figure 4B:
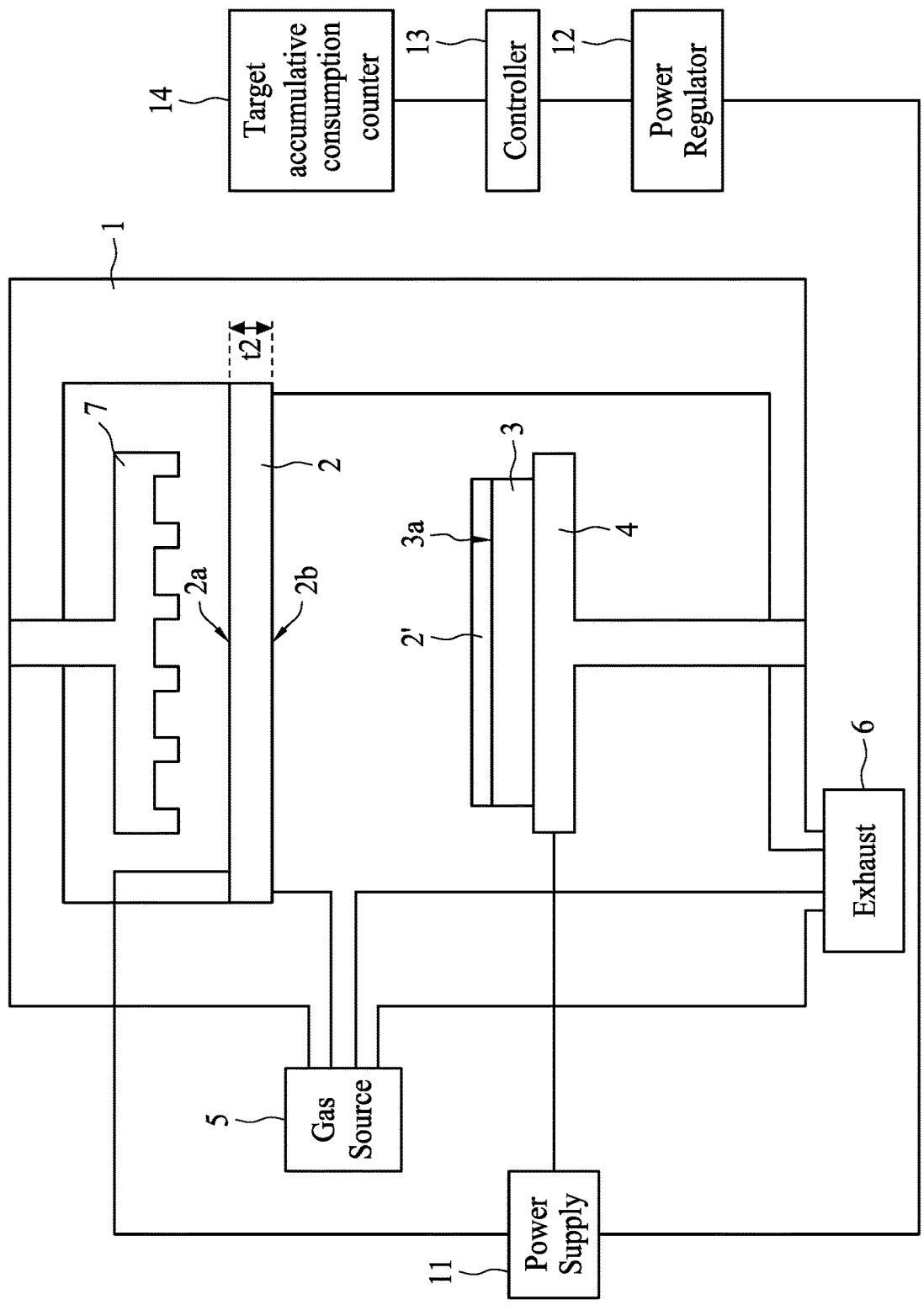

Referring to FIG. 4A and FIG. 4B, FIG. 4A and FIG. 4B are schematic drawings illustrating a sputtering apparatus 200 during intermediate stages of target sputtering operation, in accordance with some embodiments of the present disclosure. Note that hereinafter elements in FIG. 4A and FIG. 4B being the same as or similar to aforesaid counterparts in FIG. 1A are denoted by the same reference numerals, as duplicated explanations are omitted. The sputtering apparatus 200 includes the chamber 1, the supporter 4, the magnetic structure 7, a power supply 11, a controller 13, a target accumulative consumption counter 14, and a power regulator 12 for regulating the power supply 11 to adjust a magnitude of the power output of the power supply 11. The sputtering apparatus 200 is connected to the gas source 5 and the exhaust 6. The consumable target 2 and the substrate 3 are respectively electrically coupled to the power supply 11. The power supply 11 provides a power output to the consumable target 2 and the substrate 3, herein the power output can be a direct current signal or an alternating current signal. It is noteworthy that if the power supply 11 provides an alternating current signal, a magnitude of the power output of the power supply 11 can be referred to one of the following value: peak power value, peak-to-peak power value, root-mean-square value of the power output signal per se, or any other suitable indicator of a magnitude of a signal.

The power supply 11 provides a bias voltage between the top surface 2a of the consumable target 2 and the top surface 3a of the substrate 3, thereby establish an electric potential difference between the top surface 2a and the bottom surface 2b of the consumable target 2. It is noteworthy that if the power supply 11 provides an alternating current signal, a magnitude of the bias voltage and the electric potential difference can be referred to one of the following value: peak voltage value, peak-to-peak voltage value, root-mean-square voltage, or any other suitable indicator of a magnitude of electric potential difference. As previously discussed in FIG. 1A to FIG. 2B, as the consumable target 2 is sputtered and the deposited layer 2' is formed above the substrate 3, the thickness of the consumable target 2 decreases, such as from t1 to t2 as illustrated in FIG. 4A and FIG. 4B respectively, wherein t1 is greater than t2. The resistivity of the consumable target 2 illustrated in FIG. 4A is thereby less than the consumable target 2 illustrated in FIG. 4B.

Figure 5:
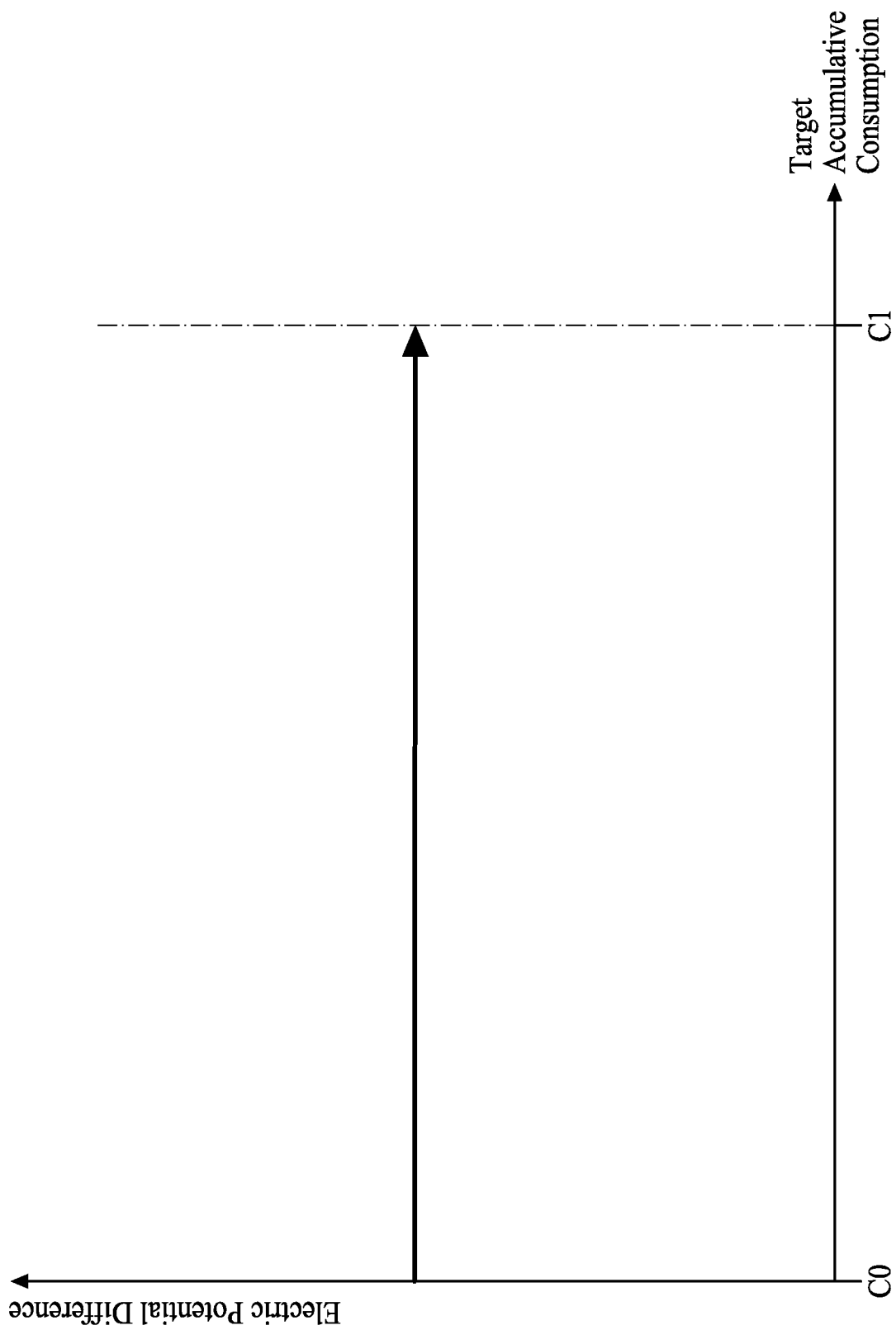
FIG. 5 is a diagram showing a relationship between a target accumulative consumption of a consumable target and an electric potential difference between a top surface and a bottom surface of a consumable target, in accordance with some embodiments of the present disclosure.

Referring to FIG. 5, FIG. 5 is a diagram showing a relationship between a target accumulative consumption of the consumable target 2 and the electric potential difference between the top surface 2a and the bottom surface 2b of the consumable target 2, in accordance with some embodiments of the present disclosure. In order to ameliorate the issues of decreasing tendency of deposition rate as well as a non-uniform predetermined property of the deposited layer 2', a magnitude of the electric potential difference sustains at a substantially fixed predetermined value. Alternatively stated, the electric potential difference between the top surface 2a and the bottom surface 2b has a substantially fixed value during the start of the target life C0 and the end of the consumption C1.

Figure 6:
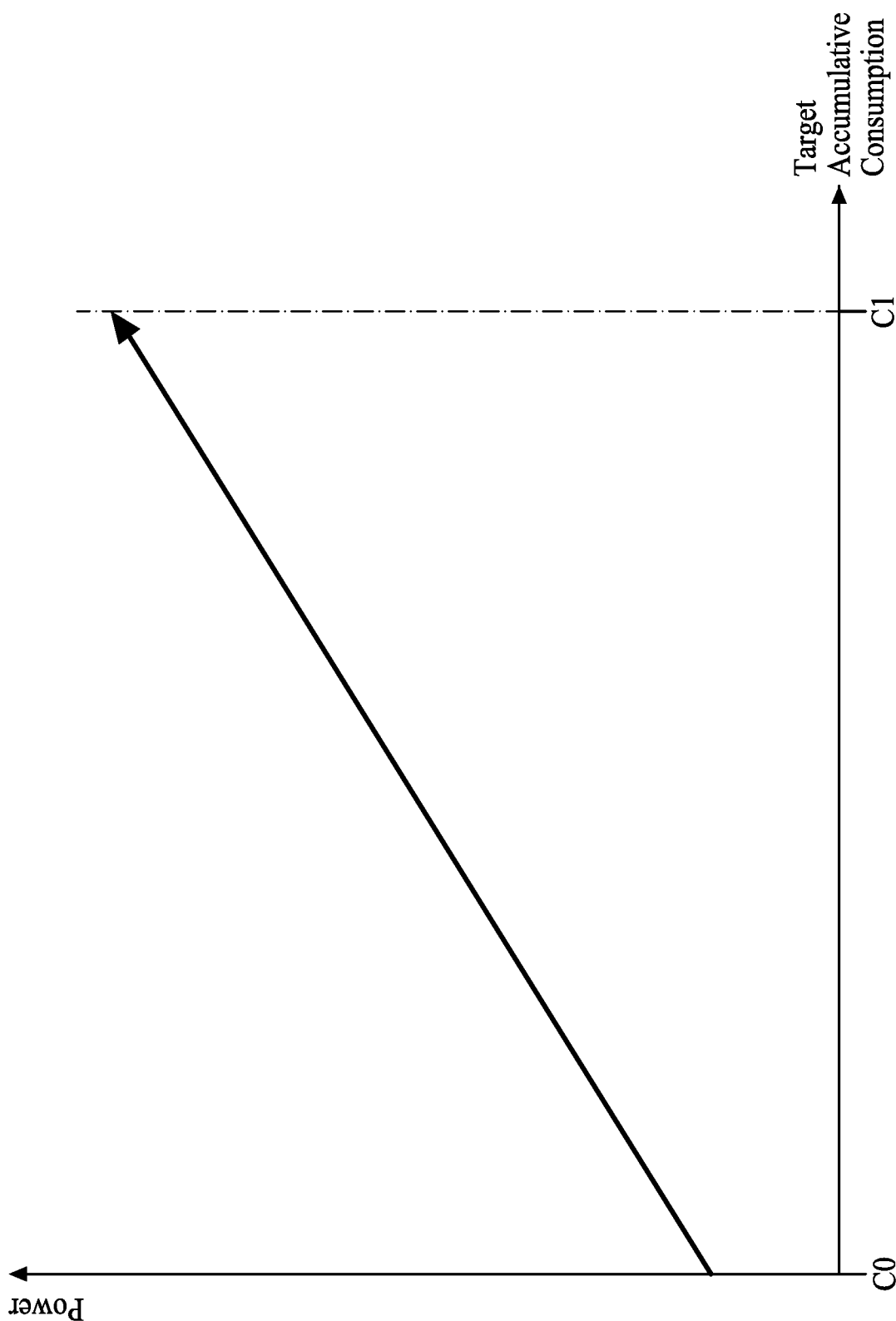
FIG. 6 is a diagram showing a relationship between a magnitude of a power output of a sputtering apparatus and a target accumulative consumption of a consumable target, in accordance with some embodiments of the present disclosure.

Referring to FIG. 4A and FIG. 6, FIG. 6 is a diagram showing a relationship between a magnitude of a power output of the sputtering apparatus 200 and a target accumulative consumption of the consumable target 2, in accordance with some embodiments of the present disclosure. In order to provide the magnitude of the electric potential difference sustaining at a substantially fixed value, the power output of the power supply 11 is adjusted to increase, or at least have a tendency of increasing, during the start of the target life C0 and the end of the consumption C1. Thus the decreasing tendency of electric potential difference resulted from the reduction of the thickness of the consumable target 2 can be compensated by the increasing tendency of the magnitude of the power output. It is noteworthy that herein the bias voltage between the top surface 2a of the consumable target 2 and the top surface 3a of the substrate 3 also sustains greater than a predetermined value.

A power regulator 12 is optionally coupled to the power supply 11 for adjusting the magnitude of the power output. For example, the power regulator 12 regulates the power supply 11 to provide the power output that increases or have an increasing tendency during the start of the target life C0 and the end of the consumption C1. Alternatively stated, the magnitude of the power output is regulated to be positively correlated to the accumulative consumption of the consumable target 2.

Figure 7:
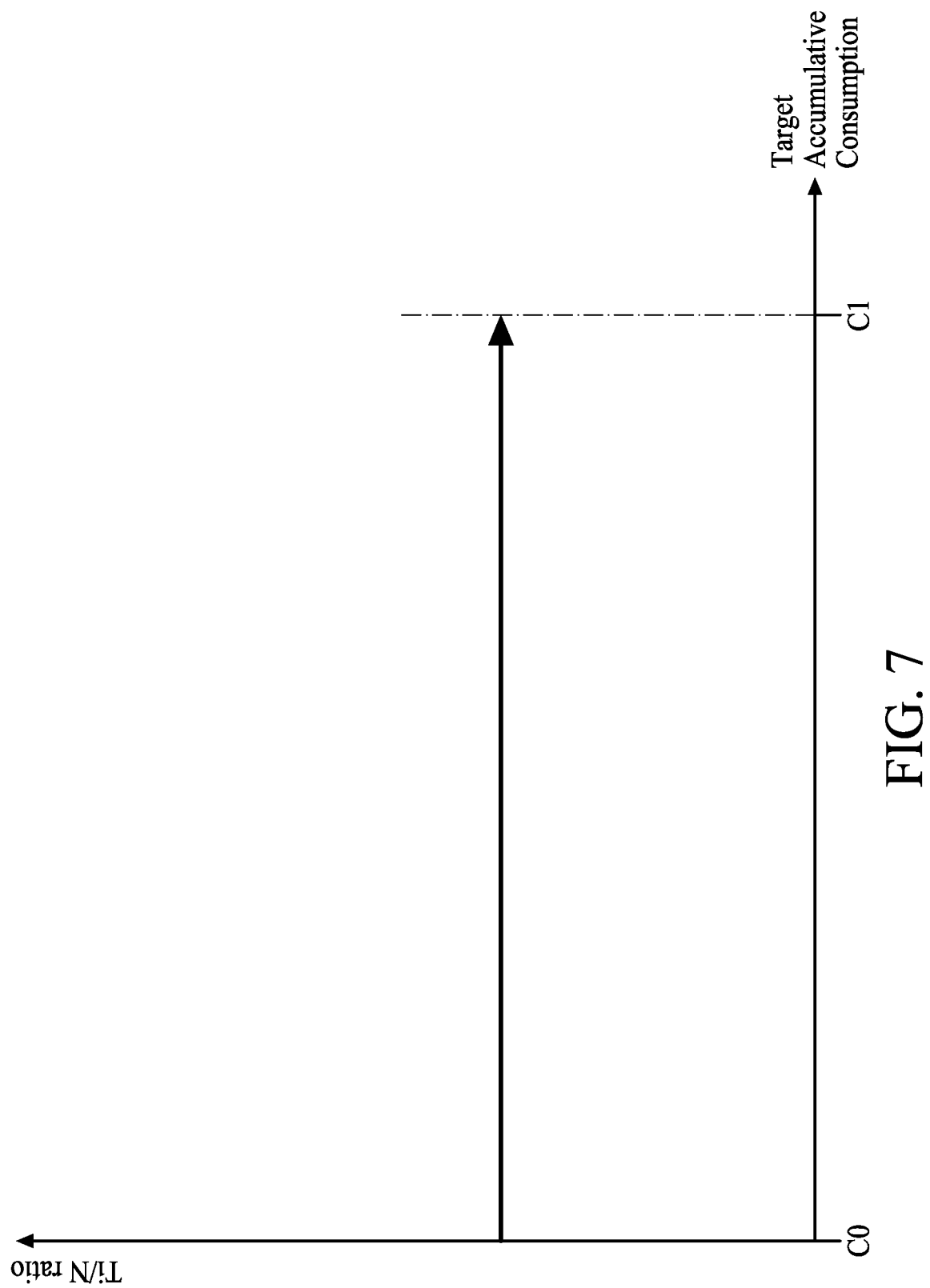
FIG. 7 is a diagram showing a relationship between a target accumulative consumption of a consumable target and a titanium-to-nitride concentration ratio of a deposited titanium nitride layer, in accordance with some embodiments of the present disclosure.

Referring to FIG. 4A and FIG. 7, FIG. 7 is a diagram showing a relationship between a target accumulative consumption of the consumable target 2 and a titanium-to-nitride concentration ratio of a deposited titanium nitride layer 2', in accordance with some embodiments of the present disclosure. Similar to the operation discussed in FIG. 2C, the consumable target 2 includes titanium (Ti) and the gas source 5 supplies nitrogen ($N_2$) into the chamber 1, thus a layer of titanium nitride (TiN) may be deposited over the top surface 3a of the substrate 3. Due to the increasing tendency of the power output provided by the power supply 11, the titanium deposition rate during the start of the target life C0 and the end of the consumption C1, a concentration of titanium as well as a ratio of titanium-to-nitride concentration ratio thereof may be fixed, thus improving the performance of the fabricated semiconductor device.

Figure 8:
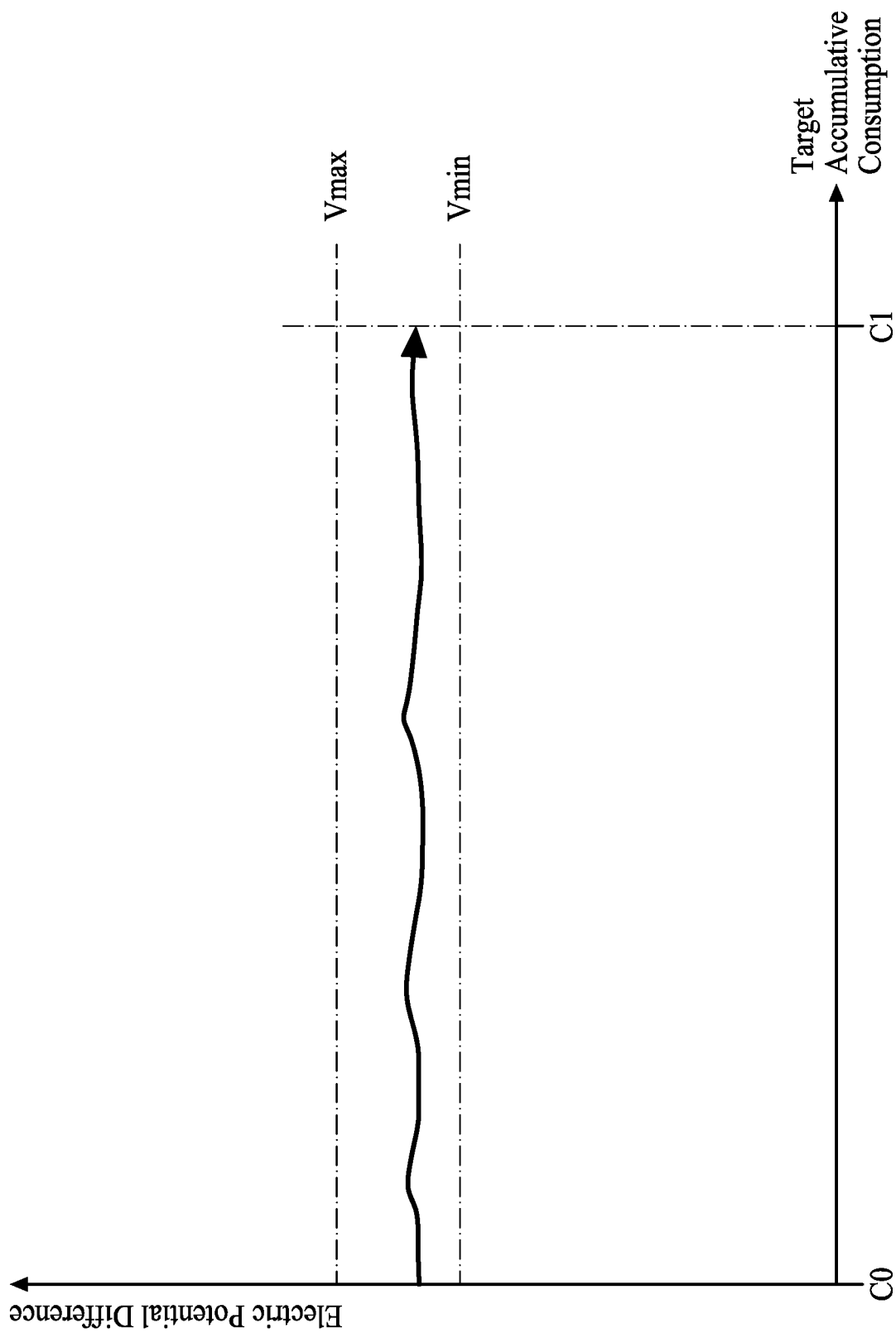
FIG. 8 is a diagram showing a relationship between a target accumulative consumption of a consumable target and an electric potential difference between a top surface and a bottom surface of a consumable target, in accordance with some embodiments of the present disclosure.

Referring to FIG. 8, FIG. 8 is a diagram showing a relationship between a target accumulative consumption of the consumable target 2 and the electric potential difference between the top surface 2a and the bottom surface 2b of the consumable target 2, in accordance with some embodiments of the present disclosure. In some embodiments, the electric potential difference may fluctuate inasmuch as any type of affection or error resulted from operation environment, the properties of material of the consumable target 2, or the like. In order to alleviate such fluctuation to deteriorate the uniformity of the material of the deposited layer 2' and/or the deposition rate thereof, the power regulator 12 regulates the power supply 11 to provide a bias voltage within a predetermined range to induce the electric potential difference between the top surface 2a and the bottom surface 2b of the consumable target 2 to fluctuate within an acceptable range. Alternatively stated, the electric potential difference sustains greater than a minimum electric potential difference $V_{min}$ and less than a maximum electric potential difference $V_{max}$ during the start of the target life C0 and the end of the consumption C1. For example, the minimum electric potential difference $V_{min}$ can be 10%, 5%, or 1% lower than an initial value of the electric potential difference at the start of the target life C0, the maximum electric potential difference Vmax can be 10%, 5%, or 1% greater than the initial value of the electric potential difference at the start of the target life C0. It is noteworthy that the disclosure is not limited to the aforesaid ranges. In some other embodiments, the maximum electric potential difference $V_{max}$ and the minimum electric potential difference $V_{min}$ may also be predetermined values. The electric potential difference being in a range from the maximum electric potential difference $V_{max}$ to the minimum electric potential difference $V_{min}$ may stabilize the deposition rate of the deposited layer 2' and ameliorate the uniformity of the material thereof.

Figure 9:
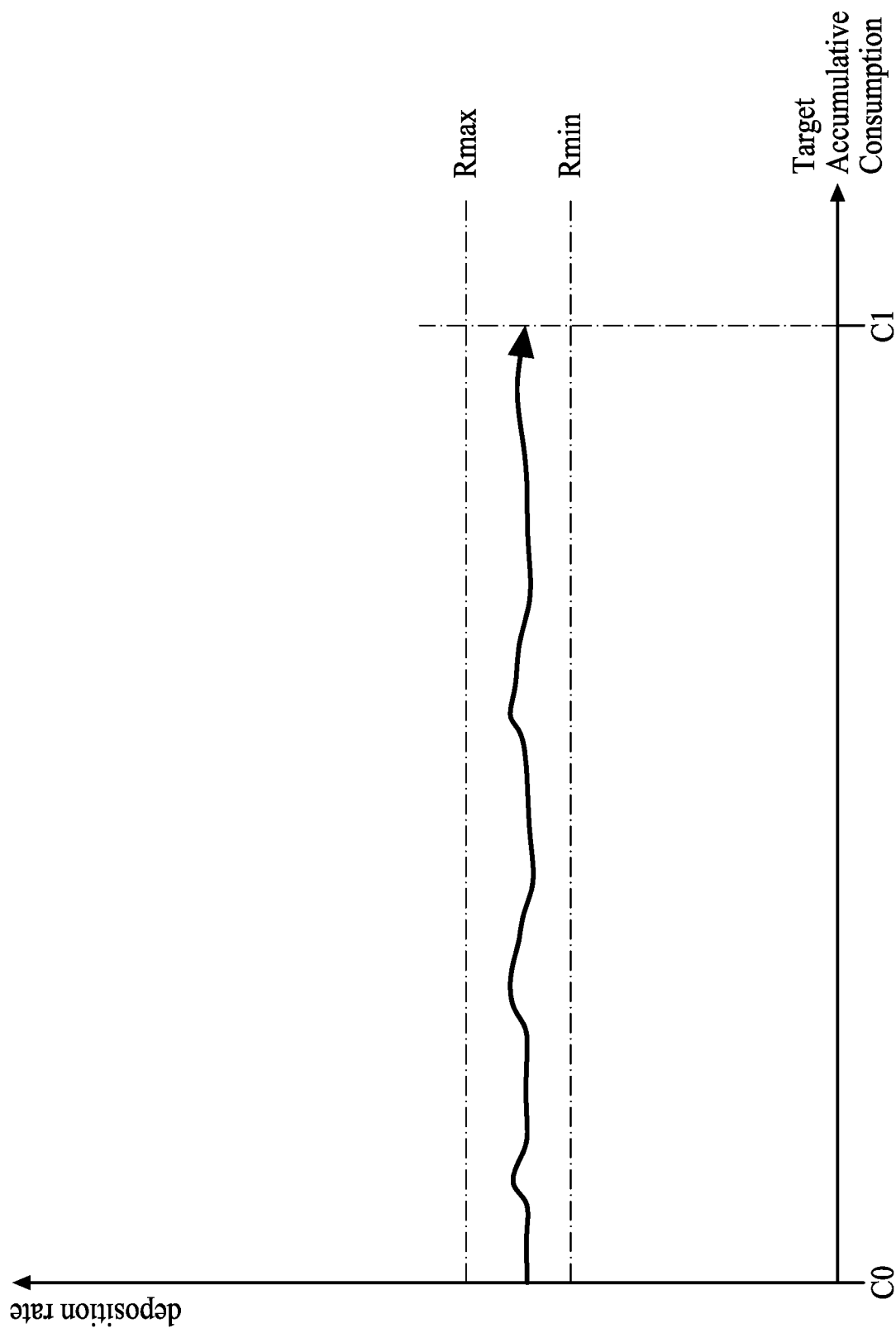
FIG. 9 is a diagram showing a relationship between a target accumulative consumption of a consumable target and a deposition rate of a titanium nitride layer, in accordance with some embodiments of the present disclosure.

Referring to FIG. 4A and FIG. 9, FIG. 9 is a diagram showing a relationship between a target accumulative consumption of the consumable target 2 and a deposition rate of the titanium nitride layer 2', in accordance with some embodiments of the present disclosure. Similar to the operation discussed in FIG. 7, the consumable target 2 includes titanium (Ti) and the gas source 5 supplies nitrogen ($N_2$) into the chamber 1, thus a layer of titanium nitride (TiN) may be deposited over the top surface 3a of the substrate 3. The titanium deposition rate sustains greater than a minimum deposition rate $R_{min}$ and less than a maximum deposition $R_{max}$ during the start of the target life C0 and the end of the consumption C1. Accordingly, a titanium-to-nitride concentration ratio of an as-deposited titanium nitride layer as well as a concentration of titanium thereof during the start of the target life C0 and the end of the consumption C1 may also be fluctuating within a predetermined acceptance range, improving the performance of the fabricated semiconductor device.

Referring to FIG. 4A, in order to control the value of the electric potential difference between the top surface 2a and the bottom surface 2b of the consumable target 2 to be a fixed value as discussed in FIG. 5 or within a predetermined range as discussed in FIG. 7, the sputtering apparatus 200 may further include the controller 13 electrically coupled to the power regulator 12 and the target accumulative consumption counter 14 electrically coupled to the controller 13. The controller 13 may store a data pertinent to the correlations between a property of the material of the consumable target 2 in a predetermined sputtering operation, a deposition rate during the start of the target life C0 and the end of the consumption C1, a magnitude of the power output during the start of the target life C0 and the end of the consumption C1, an accumulative consumption of the consumable target during the start of the target life C0 and the end of the consumption C1, an electric potential difference between the top surface 2a and the bottom surface 2b of the consumable target 2 during the start of the target life C0 and the end of the consumption C1, a feature (such as the aforesaid titanium-nitride ratio) of the material of the consumable target 2 during the start of the target life C0 and the end of the consumption C1, a resistivity of the consumable target 2 during the start of the target life C0 and the end of the consumption C1, a thickness of the consumable target 2 during the start of the target life C0 and the end of the consumption C1, bias voltage between the top surface 2a of the consumable target 2 and the top surface 3a of the substrate 3, or the like.

Under the sputtering operation, the target accumulative consumption counter 14 feeds a signal to the controller 3, wherein the signal correlates to an amount of the consumable target 2 being consumed subsequent to the start of the target life C0. Thence the target accumulative consumption counter 14 communicates with the power supply 11 by providing the signal through the controller 13. The controller 13 may communicate with the power regulator 12 to regulate the power supply 11, thereby the power supply 11 can provide a predetermined power output derived from the aforesaid data stored in the controller 13 or the target accumulative consumption counter 14.

For example, based on a data similar to the one in FIG. 2B, the electric potential difference between the top surface 2a and the bottom surface 2b may decline during the start of the target life C0 and the end of the consumption C1 without the communication from the controller 13 and/or the target accumulative consumption counter 14. Therefore a correlation between the magnitude of the power output provided by the power supply 11 and the amount of the consumable target 2 being consumed subsequent to the start of the target life C0 is provided by the controller 13 for compensating the decreasing tendency of the electric potential difference between the top surface 2a and the bottom surface 2b, so that the electric potential difference can sustain greater than a minimum electric potential difference $V_{min}$ and less than a maximum electric potential difference $V_{max}$ during the start of the target life C0 and the end of the consumption C1, as previously discussed in FIG. 7.

A correlation between the magnitude of the power output and the accumulative consumption of the consumable target 2 may be adjusted by the controller 13 to further improve the accuracy of controlling the deposition rate in the sputtering operation, as the power regulator 12 may be instructed by the controller 13 accordingly. In some embodiments, the correlation herein can be expressed in a linear equation. In some other embodiments, the correlation herein can be expressed in a quadratic equation. In some other embodiments, regression methods such as polynomial regression can be used herein. The correlation may also be offset or adjusted by other suitable methods.

Figure 10:
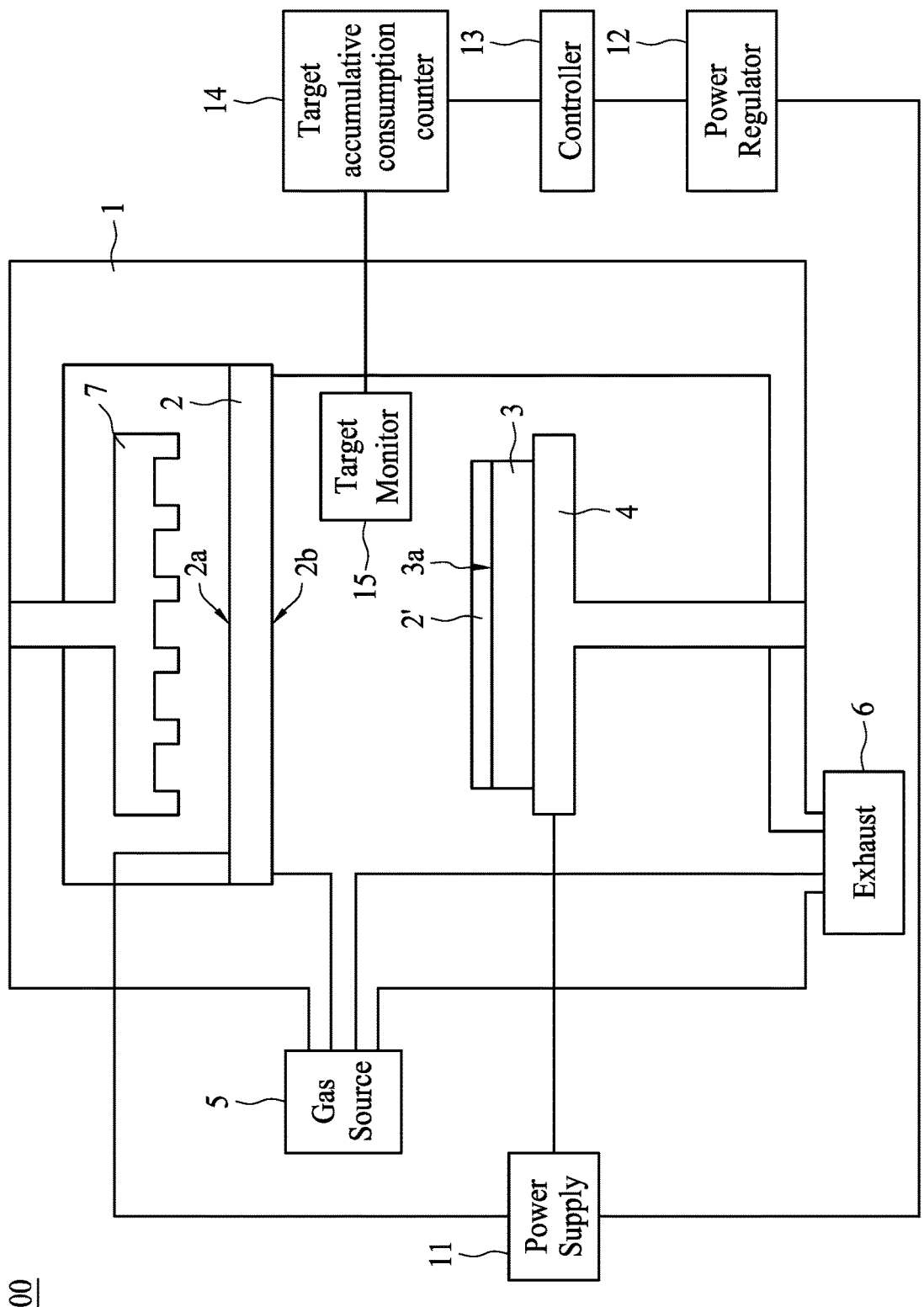
FIG. 10 is a schematic drawing illustrating a sputtering apparatus during intermediate stages of target sputtering operation, in accordance with some embodiments of the present disclosure.

Referring to FIG. 10, FIG. 10 is a schematic drawing illustrating a sputtering apparatus 200 during intermediate stages of target sputtering operation, in accordance with some embodiments of the present disclosure. The sputtering apparatus 200 provided in FIG. 4A may further include a target monitor 15 disposed in the chamber 1, which is electrically coupled to the target accumulative consumption counter 14. In some embodiments, the target monitor 15 may instantaneously provide the accumulative consumption of the consumable target 2 or the reduction rate of the thickness of the consumable target 2 to the target accumulative consumption counter 14 so that the accuracy of controlling the deposition rate in the sputtering operation can be improved. In some other embodiments, the target monitor 15 may detect a feature to the deposited layer 2', such as a titanium-to-nitride concentration ratio of the deposited layer 2', a deposition rate of the deposited layer 2', or the like and provide such information to the target accumulative consumption counter 14. By incorporating the target monitor 15 to monitor the consumable target 2 or the deposited layer 2', the correlation between the magnitude of the power output and the accumulative consumption of the consumable target 2 may be instantaneously adjusted with higher accuracy since the signal provided by the target accumulative consumption counter 14 to the controller 13 can be instantaneously updated by the target monitor 15.

The controller 13, the target accumulative consumption counter 14, and/or the target monitor 15 can be implemented by software such that the foregoing methods disclosed therein can be automatically performed during the mask making process. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, microcontroller unit (MCU) modules, discrete hardware or firmware.

Some embodiments of the present disclosure provide a sputtering apparatus 200 with methods for fabricating a semiconductor device with sputtering to ameliorate the issue of the decreasing tendency of deposition rate as well as a non-uniform property of the deposited layer 2'. By adjusting a magnitude of the power output of the power supply 11 in accordance with the accumulative consumption of the consumable target 2, such decreasing tendency of deposition rate may be compensated. For example, the power output of the power supply 11 is adjusted to increase, or at least have a tendency of increasing, during the start of the target life C0 and the end of the consumption C1, thereby the electric potential difference between the top surface 2a and the bottom surface 2b of the consumable target 2 may be a fixed value or within a predetermined range, and the uniformity of the deposition rate of the deposited layer 2' may be improved. Such compensation can be controlled by the controller 13 and the power regulator 12, wherein the controller receives a signal pertinent to the accumulative consumption of the consumable target 2 and further communicates with the power regulator 12.

Furthermore, by adjusting the correlation between the magnitude of the power output and the accumulative consumption of the consumable target 2, the accuracy of controlling the deposition rate in the sputtering operation may be improved. The target monitor 15 monitoring the consumable target 2 or the deposited layer 2' can be coupled to the target accumulative consumption counter 14 to further improve such accuracy.

Some embodiments of the present disclosure provide an apparatus for fabricating a semiconductor device with target sputtering, including a chamber for accommodating a consumable target, a target accumulative consumption counter, wherein the target accumulative consumption counter provides a signal correlated to an amount of the consumable target being consumed, and a power supply communicates with the consumable target counter, wherein the power supply provides a power output according to the signal.

Some embodiments of the present disclosure provide an apparatus for fabricating a semiconductor device with target sputtering, including a controller, a power regulator coupled to the controller, a power supply coupled to the power regulator and a consumable target, and a target accumulative consumption counter for feeding an accumulative consumption of the consumable target to the controller, wherein the power regulator is configured to regulate a power output from the power supply in accordance with the accumulative consumption of the consumable target.

Some embodiments of the present disclosure provide a method for fabricating a semiconductor device with target sputtering, including providing a chamber, loading a substrate in the chamber, providing a consumable target in the chamber, wherein the consumable target faces the substrate, providing a power output to the consumable target, and adjusting a magnitude of the power output according to an accumulative consumption of the consumable target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor device with target sputtering, comprising:
   providing a chamber;
   loading a substrate in the chamber;
   providing a consumable target in the chamber, wherein the consumable target faces the substrate;
   providing a power output electrically coupled to the consumable target to apply a bias voltage on the consumable target and the substrate; and
   adjusting a magnitude of the power output according to an accumulative consumption of the consumable target, wherein the magnitude of the power output continuously increases throughout consumption of the consumable target.

2. The apparatus of claim 1, wherein the consumable target has a first surface and a second surface opposite to the first surface, a magnitude of an electric potential difference between the first surface and the second surface sustains greater than a predetermined value.

3. The method of claim 1, wherein the adjusting a magnitude of the power output comprises regulating the magnitude of the power output to be positively correlated to the target accumulative consumption.

4. The method of claim 1, wherein the bias voltage sustains greater than a predetermined value.

5. The method of claim 1, wherein the adjusting a magnitude of the power output comprises monitoring the accumulative consumption of the consumable target.

6. The method of claim 1, wherein the adjusting a magnitude of the power output comprises monitoring a feature of the consumable target sputtered on the substrate.

7. The method of claim 1, further comprising adjusting a correlation between the magnitude of the power output and the accumulative consumption of the consumable target.

8. The method of claim 1, further comprising depositing a material of the consumable target on a surface of the substrate, wherein a rate of depositing the material of the consumable target on the surface of the substrate sustains greater than a predetermined value.

9. A method for fabricating a semiconductor device with target sputtering, comprising:
   placing a wafer in a chamber;
   providing a consumable target in the chamber;
   providing a power output to the consumable target; and
   sputtering a material of the consumable target over the wafer, comprising:
      continuously increasing a magnitude of the power output electrically coupled to the consumable target from the beginning of the sputtering and until the sputtering is terminated; and
      maintaining a deposition rate of the material to be greater than a predetermined lower limit before the sputtering is terminated.

10. The method of claim 9, further comprising supplying nitride gas into the chamber.

11. The method of claim 9, wherein the magnitude of the power output is dependent to a decrease rate of a thickness of the consumable target.

12. The method of claim 11, wherein sputtering the material of the consumable target further comprising instantaneously detecting the thickness of the consumable target.

13. The method of claim 9, wherein the deposition rate is maintained to be less than a predetermined upper limit before the sputtering is terminated.

14. The method of claim 9, further comprising calculating a target life of the consumable target.

15. A method for fabricating a semiconductor device with target sputtering, comprising:
   providing a chamber;
   loading a substrate in the chamber;
   providing a consumable target in the chamber, wherein the consumable target comprises a first material;
   supplying nitride gas into the chamber;
   providing a power output to the consumable target;
   forming a material layer over the wafer by sputtering the consumable target;
   detecting a concentration ratio of the first material over nitride in the material layer prior to the termination of the sputtering; and
   adjusting a magnitude of the power output according to the detected concentration ratio of the first material over nitride in the material layer prior to the termination of the sputtering.

16. The method of claim 15, wherein the first material is titanium.

17. The method of claim 15, wherein the concentration ratio of the first material over nitride is maintained to be within a predetermined range prior to the termination of the sputtering.

18. The method of claim 15, further comprising detecting a thickness of the consumable target prior to the termination of the sputtering.

19. The method of claim 15, wherein the magnitude of the power output right at the end of the sputtering is greater than the magnitude of the power output at the beginning of the sputtering.

20. The method of claim 15, further comprising continuously increasing the magnitude of the power output throughout the formation of the material layer.

* * * * *